(12) United States Patent
Nishikawa et al.

(10) Patent No.: US 6,273,954 B2
(45) Date of Patent: *Aug. 14, 2001

(54) SYSTEM FOR MANUFACTURING A SEMICONDUCTOR DEVICE

(75) Inventors: Kazuyasu Nishikawa; Shingo Tomohisa, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/258,399

(22) Filed: Feb. 26, 1999

(30) Foreign Application Priority Data

Sep. 3, 1998  (JP) ................. 10-249531

(51) Int. Cl.$^7$ ........................ C23C 16/00
(52) U.S. Cl. ....................... 118/692; 118/715
(58) Field of Search ..................... 118/715, 692

(56) References Cited

U.S. PATENT DOCUMENTS

| | | | |
|---|---|---|---|
| 3,653,399 | * 4/1972 | Steele | 137/334 |
| 4,436,674 | * 3/1984 | McMenamin | 261/64 |
| 4,709,858 | * 12/1987 | Stern et al. | 239/296 |
| 4,747,367 | * 5/1988 | Posa | 118/715 |
| 4,761,269 | * 8/1988 | Conger et al. | 118/679 |
| 5,054,309 | * 10/1991 | Mettes et al. | 73/1.03 |
| 5,108,535 | 4/1992 | Ono et al. . | |
| 5,182,704 | * 1/1993 | Bengtsson | 364/148 |
| 5,281,274 | * 1/1994 | Yode | 118/697 |
| 5,645,642 | * 7/1997 | Nishizato et al. | 118/692 |
| 5,665,214 | * 9/1997 | Iturralde | 204/298.03 |
| 5,698,163 | * 12/1997 | Mandel | 422/105 |
| 5,916,016 | * 6/1999 | Bothra | 451/398 |
| 6,071,572 | * 6/2000 | Mosely et al. | 427/570 |

FOREIGN PATENT DOCUMENTS

| | | |
|---|---|---|
| 4-043633 | 2/1992 | (JP) . |
| 7-109576 | 4/1995 | (JP) . |
| 7-263353 | 10/1995 | (JP) . |
| 7-335395 | 12/1995 | (JP) . |

* cited by examiner

*Primary Examiner*—Gregory Mills
*Assistant Examiner*—Sylvia R MacArthur
(74) *Attorney, Agent, or Firm*—McDermott, Will & Emery

(57) ABSTRACT

A gas supply system for supplying a gas into a reaction chamber is provided with a pulse valve, a mass flow controller and a back pressure controller. The mass flow controller includes a flow meter and a variable flow control valve, and the back pressure controller includes a pressure gauge and a pressure control valve. The pulse valve, the mass flow controller and the back pressure controller are connected to a controller so that operations thereof are controlled by this controller.

11 Claims, 11 Drawing Sheets

PULSE

Qin (sccm)

PRESSURE (mTorr)

TIME (sec)

SYSTEM FOR MANUFACTURING A SEMICONDUCTOR DEVICE

BACKGROUND OF THE INVENTION

1. Field of the Invention

The present invention relates to a system for manufacturing a semiconductor device, and more specifically, it relates to a system for forming a thin film on a surface of a sample or etching the surface of the sample with plasma.

2. Description of the Prior Art

FIG. 12 illustrates the structure of a plasma system described in Japanese Patent Laying-Open No. 7-263353 (1995). As shown in FIG. 12, the plasma system includes a reaction chamber 1, a stage 12 for receiving a sample 11 thereon, a pulse gas valve 20, a gas introduction tube 141, a pressure detector 142, a pressure controller 143 and a pressure regulator 144.

The gas introduction tube 141 supplies a gas from a gas cylinder (not shown) into the pulse gas valve 20. The pressure detector 142 and the pressure regulator 144 are connected to intermediate portions of the gas introduction tube 141. The pressure controller 143 drives the pressure regulator 144 on the basis of a signal from the pressure detector 142.

The gas introduced from the gas introduction tube 141 is supplied into the pulse gas valve 20 and pulsatively introduced into the reaction chamber 1. The pressure detector 142 sequentially detects the pressure in the gas introduction tube 141 and feeds back the same to the pressure controller 143. The pressure controller 143 controls the pressure regulator 144 for maintaining the pressure in the gas introduction tube 141 at a prescribed value.

Even if the back pressure of the pulse gas valve 20 fluctuates, therefore, the flow rate of an etching gas introduced into the reaction chamber 1 can be kept under prescribed conditions for maintaining the pressure in the reaction chamber 1 at a prescribed value.

However, the aforementioned conventional plasma system has the following problems:

In the aforementioned gas supply system, the flow rate of the gas supplied from the pulse gas valve 20 into the reaction chamber 1 is univocally determined by the pressure at the inlet of the pulse gas valve 20. In order to stably pulsatively supply the gas at a prescribed flow rate, therefore, the pressure at the inlet of the pulse gas valve 20 must be maintained constant through the pressure controller 143. The pressure controller 143 must be employed also for changing the gas flow rate. However, the gas flow rate cannot be correctly controlled or finely regulated through the pressure controller 143.

Further, the flow rate of the gas supplied into the reaction chamber 1, which is controlled by the pressure controller 143, must be calculated from the pressure in the reaction chamber 1. Therefore, the correct gas flow rate cannot be immediately recognized.

The pressure controller 143 controlling the pressure through the feedback signal from the pressure detector 142 is effective for slow pressure change. However, the pressure controller 143 cannot cope with abrupt pressure change, and hence it is difficult to maintain the gas flow rate at a constant value when remarkable pressure change takes place.

In case of supplying a gaseous mixture into the reaction chamber 1 through the single pulse gas valve 20, the gas mixing ratio (flow ratio partial pressure ratio) is determined through the ratios of the specific heat of the gases and the pressure at the inlet of the pulse gas valve 20. When the difference between the ratios of specific heat of the gases or the pressure difference between the gases is remarkable, therefore, it is difficult to obtain a desired mixing ratio.

In case of employing a plurality of pulse gas valves 20 or exchanging the pulse gas valve 20, gases are supplied at different flow rates even if the valves 20 are pulsatively driven under the same conditions, due to the individual difference between the opening degrees thereof. It is difficult to obtain a desired gas flow rate also in this case.

When supplying a gas into a plurality of reaction chambers 1 from a single gas cylinder and starting processing in one of the reaction chambers 1 during processing in another reaction chamber 1, the pressure in a pipe temporarily fluctuates to change the flow rate of the gas supplied into the reaction chambers 1. It is difficult to obtain a desired gas flow rate also in this case.

SUMMARY OF THE INVENTION

The present invention has been proposed in order to solve the aforementioned various problems, and an object thereof is to control the flow rate of a gas supplied into a reaction chamber at a desired value under all situations.

Another object of the present invention is to control the mixing ratio of gases supplied into a reaction chamber 1 at a desired value under all situations.

A manufacturing system according to the present invention includes a reaction chamber, a gas supply system, a pulse valve, a gas flow controller, a back pressure controller, and a control part. The gas supply system supplies a gas into the reaction chamber. The pulse valve is provided on the gas supply system and pulsatively supplies the gas into the reaction chamber. The gas flow controller is provided on the gas supply system and controls the flow rate of the gas supplied to the pulse valve. The back pressure controller is provided on the gas supply system and controls the back pressure of the pulse valve. The control part controls the operations of the pulse valve, the gas flow controller and the back pressure controller.

The gas flow rate can be finely regulated by providing the gas flow controller as described above. The back pressure controller can suppress fluctuation of the back pressure of the pulse valve, for suppressing fluctuation of the gas flow rate resulting from fluctuation of the back pressure. Consequently, the gas flow rate can be correctly controlled and finely regulated. Further, the gas flow rate can be immediately detected due to employment of the gas flow controller. Even if the difference between ratios of specific heat of gases or pressure difference between gases is remarkable, a desired mixing ratio can be obtained by employing the gas flow controller as well as the back pressure controller, and the gas flow rate can be controlled despite individual difference between pulse valves or fluctuation of the pressure in a pipe. The problems of the prior art can be solved in the aforementioned manner, while the gas flow controller and the back pressure controller can be controlled to compensate for mutual disadvantages. This also can contribute to correct control of the gas flow rate.

The back pressure controller is preferably connected to an inlet of the gas flow controller.

Thus, a gas controlled at a constant pressure can be supplied to the gas flow controller, for stably supplying a prescribed volume of gas into the reaction chamber. This is particularly effective for abrupt pressure change.

The gas flow controller preferably includes a flow meter and a variable flow control valve. The back pressure controller preferably includes a pressure gauge and a pressure control valve. The control part preferably selects at least either flow control by the variable flow control valve or back pressure control by the pressure control valve in response to change of the gas flow rate detected by the flow meter.

Thus, the preferable control system can be selected in response to change of the gas flow rate, whereby the flow rate of the gas can be correctly and readily controlled.

The control part may select at least either the flow control by the variable flow control valve or the back pressure control by the pressure control valve in response to the pressure of the gas detected by the pressure gauge.

Also in this case, the flow rate of the gas can be correctly and readily controlled similarly to the above.

Preferably, the gas flow controller is a mass flow controller. In this case, the pulse valve and the mass flow controller are preferably integrated or directly connected with each other.

Thus, it is possible to prevent difference between a value indicated by the mass flow controller and the actual flow rate due to conductance between the pulse valve and the mass flow controller. This can also contribute to correct gas flow control.

The gas supply system preferably has a gas cylinder and a regulator for reducing the pressure of the gas from the gas cylinder and preventing the pulse valve, the gas flow controller and the like from breakage. The back pressure controller preferably has both of a decompressing (reducing) function and a pressure intensifying (pressurizing) function.

The pulse valve, the gas flow controller and the like can be prevented from breakage due to the regulator. Further, the back pressure of the pulse valve can be controlled due to the decompressing function and the pressure intensifying function of the back pressure controller.

The gas supply system may have a gas cylinder charged with a gas having a low vapor pressure. In this case, the gas supply system is connected to only one reaction chamber. Throughout the specification, the term "gas having a low vapor pressure" indicates a gas such as liquefied gas having a vapor pressure of less than several atm.

Thus, interference from another reaction chamber can be eliminated and the gas flow rate can be maintained at a prescribed value.

The manufacturing system preferably includes a plurality of gas supply systems. Each gas supply system is preferably provided with both of the gas flow controller and the back pressure controller.

Thus, the aforementioned flow control can be performed in every gas supply system.

A single pulse valve may be provided for the plurality of gas supply systems.

In this case, fluctuation of the gas flow rate resulting from individual difference between pulse valves can be avoided. Also when supplying a plurality of gases into the reaction chamber through a single pulse valve, the gases can be supplied in a desired mixing ratio by performing the aforementioned flow control according to the present invention.

Alternatively, the pulse valve may be provided for each gas supply system.

If the pressure difference between the gases is remarkable, it is easier to control the flow rate by providing the pulse valve for each gas supply system as compared with the case of supplying a plurality of gases into the reaction chamber through a single pulse valve. In this case, into the reaction chamber through a single pulse valve. In this case, fluctuation of the gas flow rate resulting from individual difference between the pulse valves can be effectively suppressed by employing both of the gas flow controller and the back pressure controller.

The gas supply system may share the gas cylinder with another gas supply system connected with another reaction chamber.

If simultaneously performing processing in a plurality of reaction chambers supplied with a gas from the same gas cylinder, the pressure in a pipe may fluctuate. However, the gas can be stably supplied into the reaction chambers by employing both of the gas flow controller and the back pressure controller.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to FIGS. 1 to 11.

(Embodiment 1)

Figure 1:
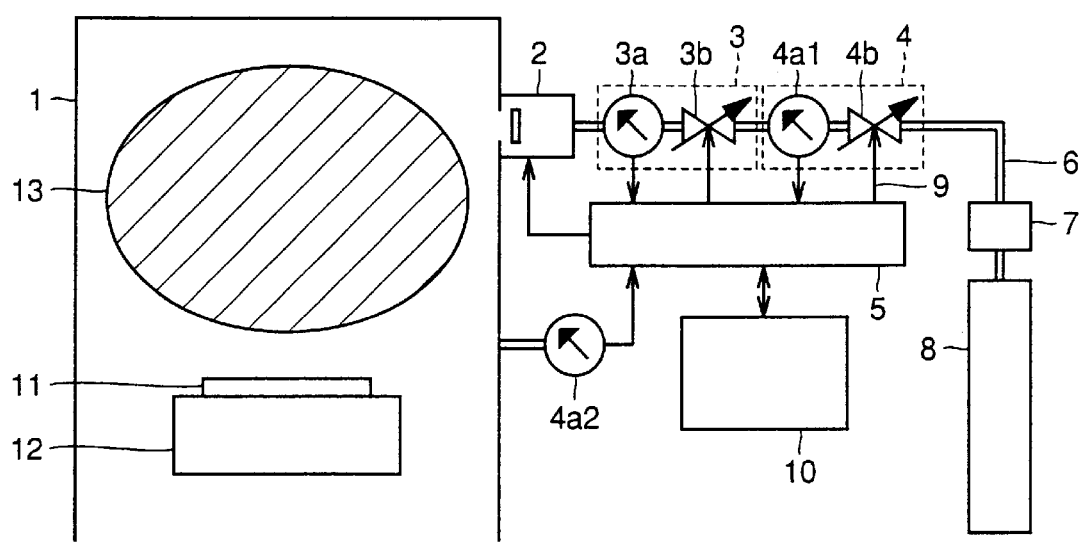
FIG. 1 is a block diagram showing a plasma system according to an embodiment 1 of the present invention.

An embodiment 1 of the present invention is described with reference to FIGS. 1 to 5. FIG. 1 is a block diagram showing a plasma system (apparatus) according to the embodiment 1 of the present invention.

As shown in FIG. 1, the plasma system includes a reaction chamber 1, a pulse valve 2, a mass flow controller (gas flow controller) 3, a back pressure controller 4, a controller (control part) 5, a gas pipe 6, a regulator 7, a gas cylinder 8, a computer 10 and a stage 12.

The pulse valve 2 can pulsatively supply a gas into the reaction chamber 1. The mass flow controller 3 including a flow meter 3a and a variable flow control valve 3b controls the flow rate of the gas. The back pressure controller 4 has a pressure gauge 4a1 and a pressure control valve 4b. The back pressure controller 4 has a decompressing (reducing) function and a pressure intensifying (pressurizing) function, and controls the pressure of the gas to be constant with respect to a certain set value.

The controller 5 is connected with the pulse valve 2, the mass flow controller 3 and the back pressure controller 4 through signal lines 9 and controls the operations thereof. The controller 5 is also connected with the computer 10. The controller 5 is further connected with a pressure gauge 4a2.

The regulator 7 for preventing the pulse valve 2, the mass flow controller 3 and the like from breakage reduces the pressure of the gas supplied from the gas cylinder 8.

A sample 11 is placed on the stage 12. This sample 11 is processed with plasma in the reaction chamber 1.

In the aforementioned structure, the gas introduced into the gas pipe 6 from the gas cylinder 8 is supplied to the pulse valve 2, to be pulsatively supplied into the reaction chamber 1. The pressure gauge 4a1 sequentially detects the pressure in the gas pipe 6, and the back pressure controller 4 operates for maintaining the pressure at an inlet of the mass flow controller 3 at a prescribed value. The mass flow controller 3 controls the flow rate of the gas maintained at the constant pressure, and supplies the gas to the pulse valve 2.

At this time, the mass flow controller 3 can finely regulate the gas flow rate. Further, the back pressure controller 4 can supply the gas to the inlet of the mass flow controller 3 at a constant pressure as described above. Even if the gas pressure changes in the gas pipe 6 between the gas cylinder 8 and the back pressure controller 4, therefore, it is possible to prevent abrupt fluctuation of the pressure at the inlet of the mass flow controller 3. Thus, the gas can be prevented from jetting out from the mass flow controller 3 at a flow rate exceeding the set value.

When the pressure in the gas pipe 6 is reduced below the set value, however, the back pressure controller 4 must operate to pressurize the gas in gas pipe 6 and hence a certain degree of time is required for attaining a constant pressure. Further, the back pressure controller 4 may be incapable of coping with abrupt fluctuation of the pressure in the gas pipe 6. Also in this case, the back pressure controller 4 slows down the fluctuation of the gas pressure and hence it is possible to prevent the pressure at the inlet of the mass flow controller 3 from abrupt fluctuation. Therefore, the gas can be prevented from jetting out from the mass flow controller 3 at a flow rate exceeding the set value.

Figure 5A:
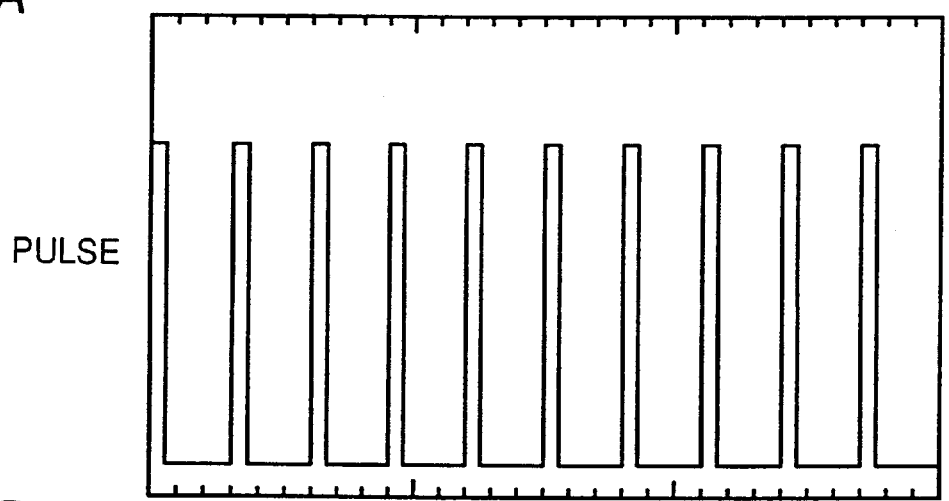
FIGS. 5A to 5C illustrate a pulse operation of a pulse valve, a flow rate $Q_{in}$ of a gas supplied from the pulse valve and following pressure change in a reaction chamber respectively.
Figure 5B:
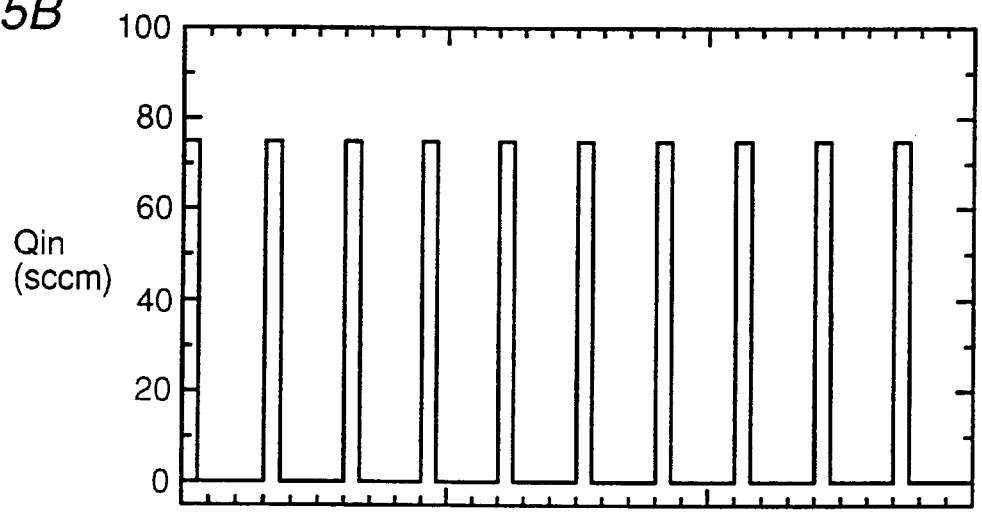
Figure 5C:
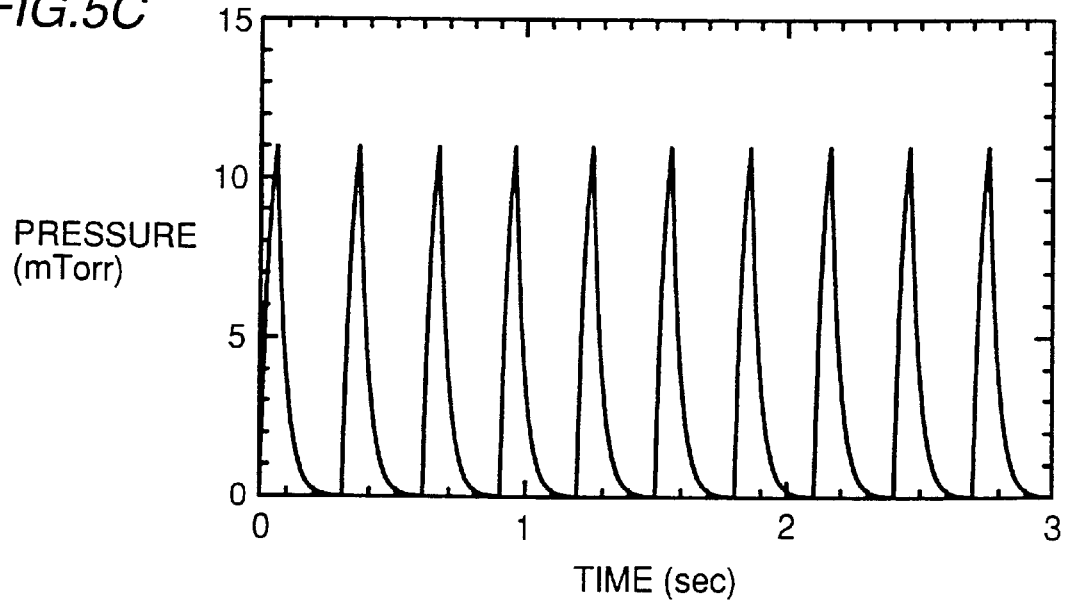

It is also possible to cope with abrupt pressure fluctuation in the following manner. When the mass flow controller 3 is fully opened under pulse valve operating conditions shown in FIGS. 5A to 5C, the maximum suppliable flow rate is 76 sccm at 0.5 atm. or 227 sccm at 1.5 atm. Referring to FIGS. 5A to 5C, the mass flow controller 3 is set at a flow rate of 70 sccm, and hence the gas can be supplied into the reaction chamber 1 at a constant flow rate even if the pressure abruptly changes from 1.5 atm. to 0.5 atm. and a time is required for coping with this change. Even if remarkable pressure fluctuation takes place, the gas can be stably supplied into the reaction chamber 1 at a desired flow rate by setting the flow rate of the mass flow controller 3 below the maximum flow rate at the predicted minimum pressure.

When the pulse valve 2 is exchanged, it is difficult to obtain a desired gas flow rate since the new pulse valve supplies the gas at a different flow rate even if the same is pulsatively driven under the same conditions, due to the opening degree varying with the pulse valve 2. However, the desired gas flow rate can be obtained by controlling the flow rate with the mass flow controller 3.

It is possible to prevent possible difference between a value indicated by the mass flow controller 3 and the actual flow rate resulting from the conductance of the pipe 6 connecting the pulse valve 2 with the mass flow controller 3 by integrating or directly connecting the mass flow controller 3 with the pulse valve 2. The mass flow controller 3 can be integrated with the pulse valve 2 by adding a function of changing the internal conductance within a certain range to the pulse valve 2 and assembling a flow meter into the same, for example.

Even if the pressure in the gas pipe 6 fluctuates, the flow rate of the gas such as an etching gas introduced into the reaction chamber 1 can be maintained at a prescribed value by controlling the back pressure and the flow rate through the aforementioned structure. Thus, the pressure in the reaction chamber 1 can be maintained under prescribed conditions.

The basic idea of the method of controlling the gas flow rate specific to the present invention is now described with reference to FIGS. 2A to 2C.

According to the present invention, the gas flow rate can be controlled through both of back pressure control for controlling the back pressure of the pulse valve 2 and flow control by the mass flow controller 3 with compensation for mutual disadvantages. Thus, a desired gas flow rate can be accurately obtained. The reason for this is now described in detail.

A problem in case of controlling the flow rate only by back pressure control is now described.

Figure 2A:
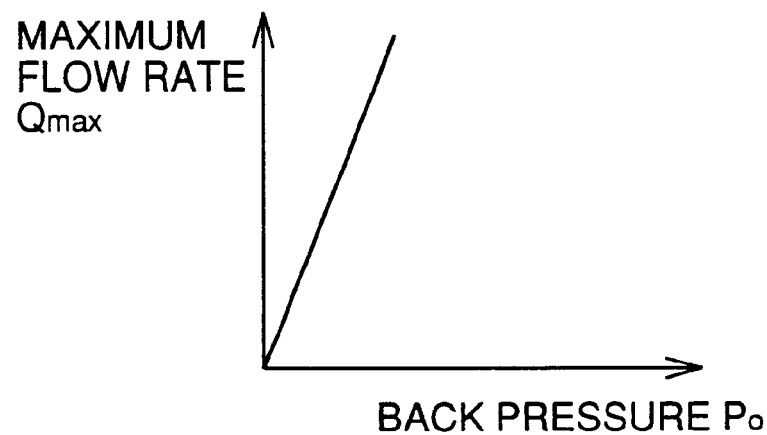
FIGS. 2A to 2C illustrate relations between maximum flow rates $Q_{max}$ of gases and back pressures $P_o$.
Figure 2B:
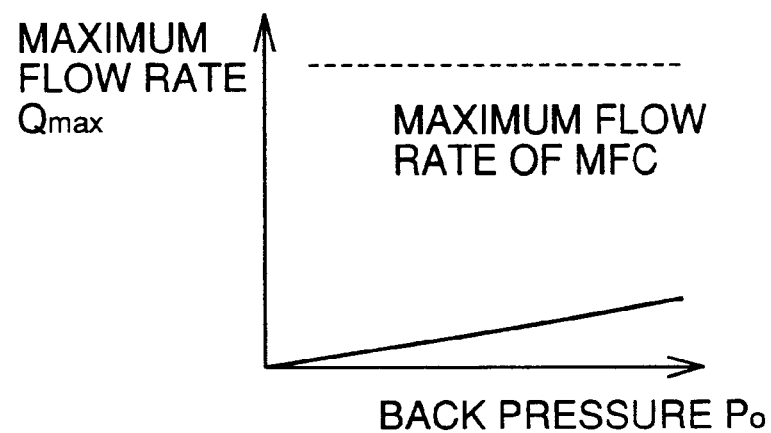
Figure 2C:
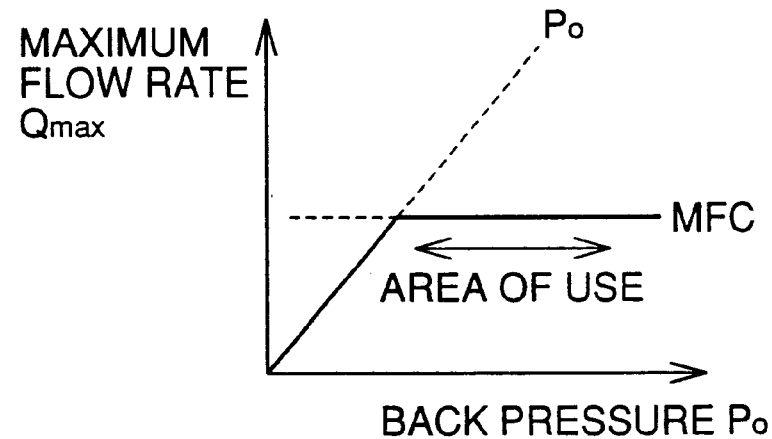

When the gas flow rate Q remarkably increases with respect to the back pressure Po as shown in FIG. 2A, the gas flow rate changes susceptively to slight change of the back pressure. Therefore, a fluctuation of the back pressure with respect to the set value must be extremely reduced. In practice, it is difficult to supply the gas at a constant flow rate due to a certain fluctuation of the back pressure.

A problem in case of controlling the flow rate only with the mass flow controller 3 is now described. Referring to FIG. 2B, a dotted line shows the maximum flow rate of the mass flow controller (MFC) 3. If the maximum flow rate of the mass flow controller 3 is excessive, an error increases when feeding the gas at a small flow rate. When feeding a gas having a low vapor pressure, the pressure applied to the mass flow controller 3 is so small that the gas is hard to feed. Thus, it is difficult to supply the gas at a constant flow rate.

In order to obtain a desired gas flow rate by solving the aforementioned problems, the pulse valve 2, the mass flow controller 3 and the back pressure controller 4 are properly controlled in the present invention. As shown in FIG. 2C, flow rate setting by the mass flow controller 3 prevents instability of the flow rate due to a fluctuation of the back pressure. In a region with a low pressure, the accuracy is improved by controlling the flow rate not with the mass flow controller 3 but with the back pressure of the pulse valve 2, and hence the respective elements are controlled for performing the back pressure control. Thus, a desired gas flow rate can be obtained under any conditions.

Figure 3:
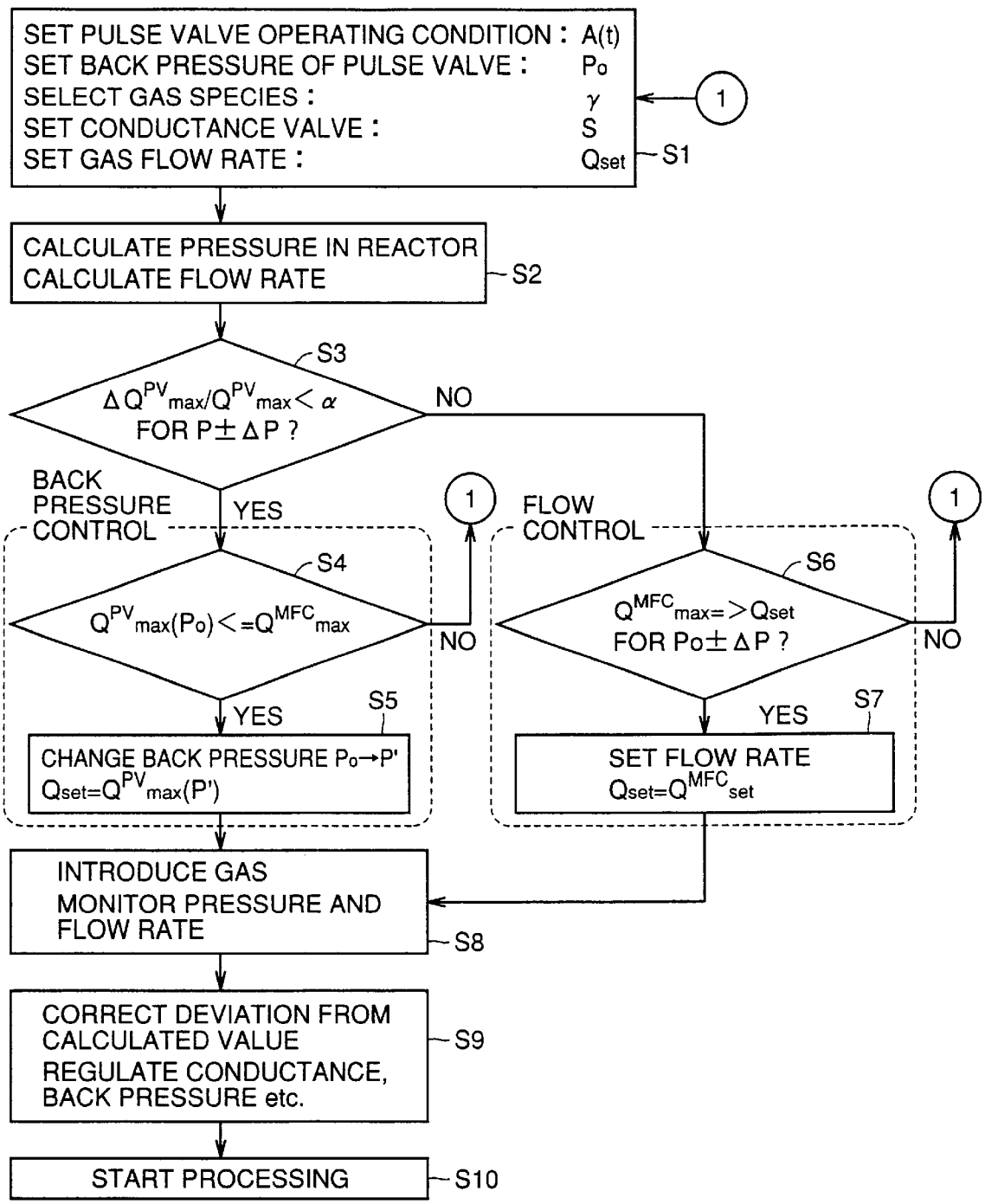
FIG. 3 is a flow chart showing an exemplary method of controlling a gas flow rate in the embodiment 1.
Figure 4:
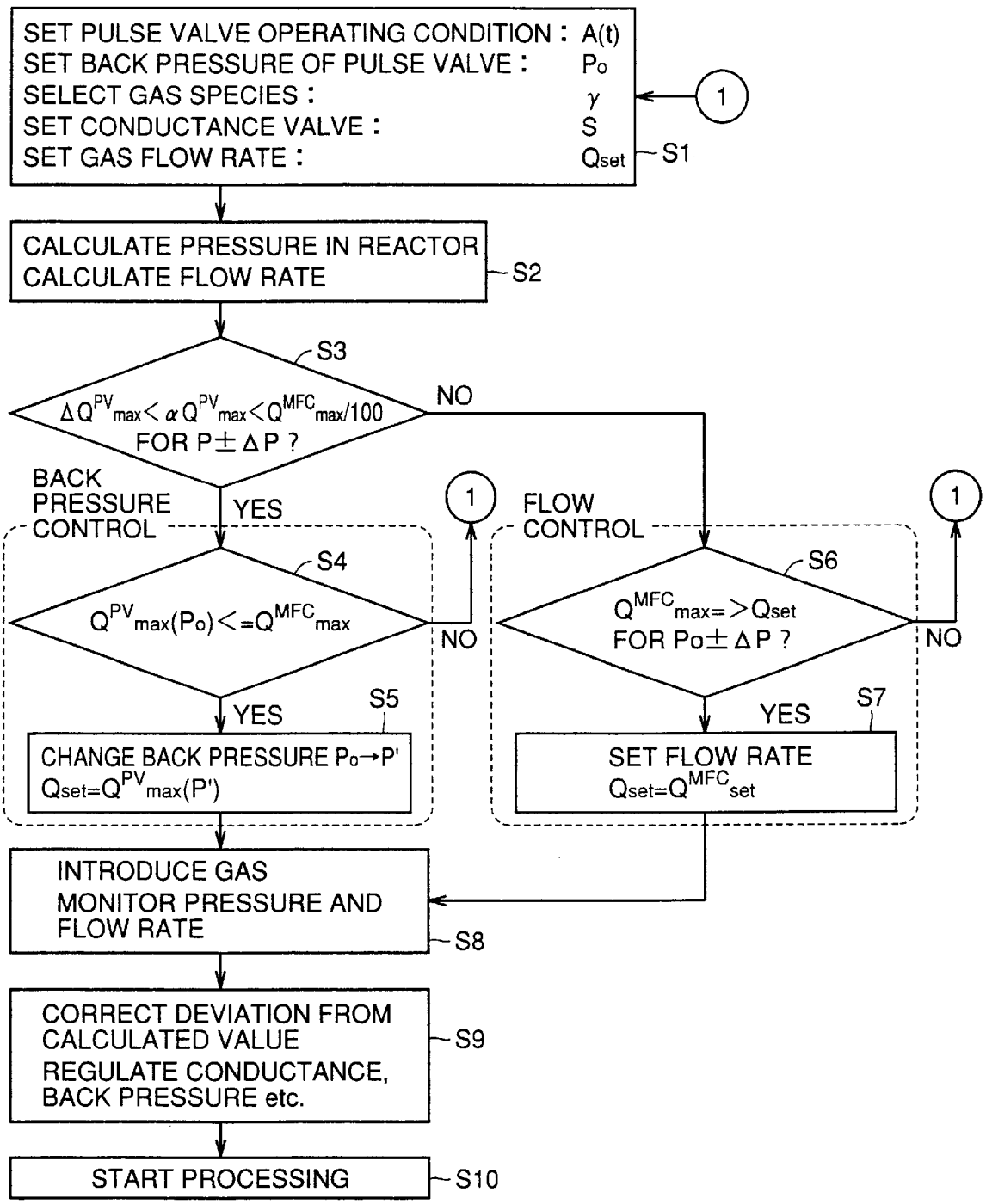
FIG. 4 is a flow chart showing another exemplary method of controlling a gas flow rate in the embodiment 1.

Exemplary methods of controlling the pulse valve 2, the mass flow controller 3 and the back pressure controller 4 with the controller 5 are now described with reference to FIGS. 3 and 4. FIGS. 3 and 4 are flow charts showing the control methods.

Referring to FIG. 3, various conditions are set at a step S1. The term "pulse valve operating condition" indicates an ON/OFF time of the pulse valve 2 (time change of the opening degree of the pulse valve 2). A conductance valve is set under prescribed conditions for regulating a pumping speed.

After setting the conditions, the controller 5 calculates the pressure P in the reactor (reaction chamber) 1 and the flow rate of the gas. The pressure P in the reaction chamber 1 and the mass flow rate m can be obtained through the following expressions (1) and (2):

$$\frac{dP(t)}{dt} = P_0 \frac{v_s A(t)}{V} \left(\frac{2}{\gamma+1}\right)^{(\gamma+1)/2(\gamma-1)} - \frac{S}{V} P \quad (1)$$

$$\frac{dm}{dt} = \frac{\gamma S P}{v_s^2} \quad (2)$$

where Po represents the pressure (back pressure) applied to the pulse valve 2, Vs represents the sound velocity, A(t) represents time change of the opening degree of the pulse valve 2, V represents the volume of the reaction chamber 1, S represents the pumping speed, m represents the mass of the gas, and γ represents the ratio of specific heat of the gas. While the above mathematical expressions are on the premise that the gas is an ideal gas, the inventors have confirmed that the pressure obtained from these mathematical expressions well matches with an experimental value.

At a step S3, the controller 5 determines either the back pressure control or the flow rate control on the basis of flow rate change with respect to pressure change. Referring to FIG. 3, P represents the pressure and ΔP represents dispersion of the pressure. The pressure P is within a controllable region. Further, $Q^{PV}_{max}$ represents the maximum flow rate of the gas flowable from the pulse valve 2 under the pressure P, and $\Delta Q^{PV}_{max}$ represents dispersion (width of deflection) of the flow rate with respect to the ΔP. The maximum flow rate may be replaced with a mean flow rate.

α defines the width of deflection of the flow rate of the gas from the pulse valve 2. In general, the limit of the flow control of the mass flow controller 3 is about 1% of the maximum flow rate thereof. For example, a mass flow controller 3 having the maximum flow rate of 10 sccm can control the flow rate with accuracy of 0.1 sccm. When α is within 1%, therefore, the flow rate can be more correctly controlled with back pressure control as compared with that with the mass flow controller 3.

In consideration of the above, the controller 5 selects the back pressure control when the value of $\Delta Q^{PV}_{max}/Q^{PV}_{max}$ is smaller than α, while selecting the flow rate control when the value of $\Delta Q^{PV}_{max}/Q^{PV}_{max}$ is not less than α.

When controlling the back pressure, the controller 5 compares the maximum flow rate $Q^{PV}_{max}(Po)$ of the gas flowable from the pulse valve 2 at the back pressure Po with the maximum flow rate $Q^{MFC}_{max}$ of the mass flow controller 3. If $Q^{PV}_{max}(Po)$ is below $Q^{MFC}_{max}$, the controller 5 changes the back pressure from Po to P' and sets the gas flow rate $(Q_{set})$ at $Q^{PV}_{max}(P')$ at a step S5.

If $Q^{PV}_{max}(Po)$ is larger than $Q^{MFC}_{max}$ at the step S4, the process returns to ① in FIG. 3.

When controlling the flow rate, on the other hand, the controller 5 compares $Q^{MFC}_{max}$ with $Q_{set}$ at a step S6. In other words, the controller 5 determines whether or not the set flow rate $Q_{set}$ is below the maximum flow rate $Q^{MFC}_{max}$ of the mass flow controller 3 within a pressure region (Po±ΔP). If $Q^{MFC}_{max}$ is in excess of $Q_{set}$, the controller 5 sets the value $Q^{MFC}_{max}$ as the gas flow rate at a step S7. If $Q^{MFC}_{max}$ is smaller than $Q_{set}$, on the other hand, the process returns to ① in FIG. 3.

After setting the gas flow rate by controlling the back pressure or the flow rate in the aforementioned manner, the controller 5 introduces the gas into the reaction chamber 1 and measures the pressure and the gas flow rate at a step S8.

Thereafter the controller 5 corrects deviation from the calculated values and regulates the conductance, the back pressure and the like at a step S9, and starts the processing at a step S10.

The other control method is now described with reference to FIG. 4. As shown in FIG. 4, only the content of a step S3 is different from that in FIG. 3, and the remaining contents of this method are similar to those in FIG. 3.

At the step S3 in the flow chart shown in FIG. 4, the controller 5 compares values $\Delta Q^{PV}_{max}$, $\alpha Q^{PV}_{max}$ and $Q^{MFC}_{max}/100$ for pressure change with each other. The controller 5 selects the back pressure control when these values satisfy the conditions at the step S3 in FIG. 4. Otherwise the controller 5 selects the flow rate control.

In case of performing control in practice in accordance with either flow chart, it is preferable to obtain data (calculated values and actual values) of the gas flow rate, the conductance valve, the back pressure and the like in advance. Thus, deviation between the calculated values and the actual values can be corrected or regulated before starting the processing, for reducing the time required before starting the processing.

Also in case of employing a plurality of gas species, the controller 5 may perform control similar to that shown in FIG. 3 or 4 while setting a flow ratio in initialization. While the controller 5 controls the gas flow rate at a certain value in the flow chart shown in each of FIGS. 3 and 4, a control method under a constant pressure or that rendering the difference between the maximum and minimum values of the pressure constant is also conceivable.

In case of employing a gas having a low vapor pressure, the controller 5 may control the gas flow rate only by controlling the back pressure with no flow control with the mass flow controller 3.

With reference to FIGS. 5A to 5C, pressure change in the reaction chamber 1 shown in FIG. 1 pulsatively supplied with the gas is now described. Referring to FIGS. 5A to 5C, the pulse valve 2 having an orifice of 0.5 mm in diameter is driven under an opening time of 60 msec. and a cycle period of 300 msec. for supplying chlorine gas into the reaction chamber 1. The pressure of the chlorine gas is set at 1 atm. at the inlet of the mass flow controller 3, while the flow rate of the mass flow controller 3 is set at 70 sccm. The gas pressure set value (1 atm.) is lower than the pressure of the gas cylinder 8 decompressed by the regulator 7.

It is understood from FIGS. 5A to 5C that the gas is supplied into the reaction chamber 1 at a flow rate (Qin) substantially equal to the set flow rate of the mass flow controller 3 in response to the pulse operation of pulse valve 2, to result in change of the pressure in the reaction chamber 1. The gas can be stably supplied into the reaction chamber 1 at a constant flow rate, as shown in FIGS. 5A to 5C.

(Embodiment 2)

An embodiment 2 of the present invention is now described with reference to FIGS. 6 and 7A to 7C. According to the embodiment 2 of the present invention, a single pulse valve 2 supplies a plurality of types of gases. For example, the pulse valve 2 supplies a gaseous mixture of chlorine and oxygen into a reaction chamber 1. With reference to the embodiment 2 and embodiments 3 to 5 of the present invention, equipment structures are illustrated in a simplified manner.

Figure 6:
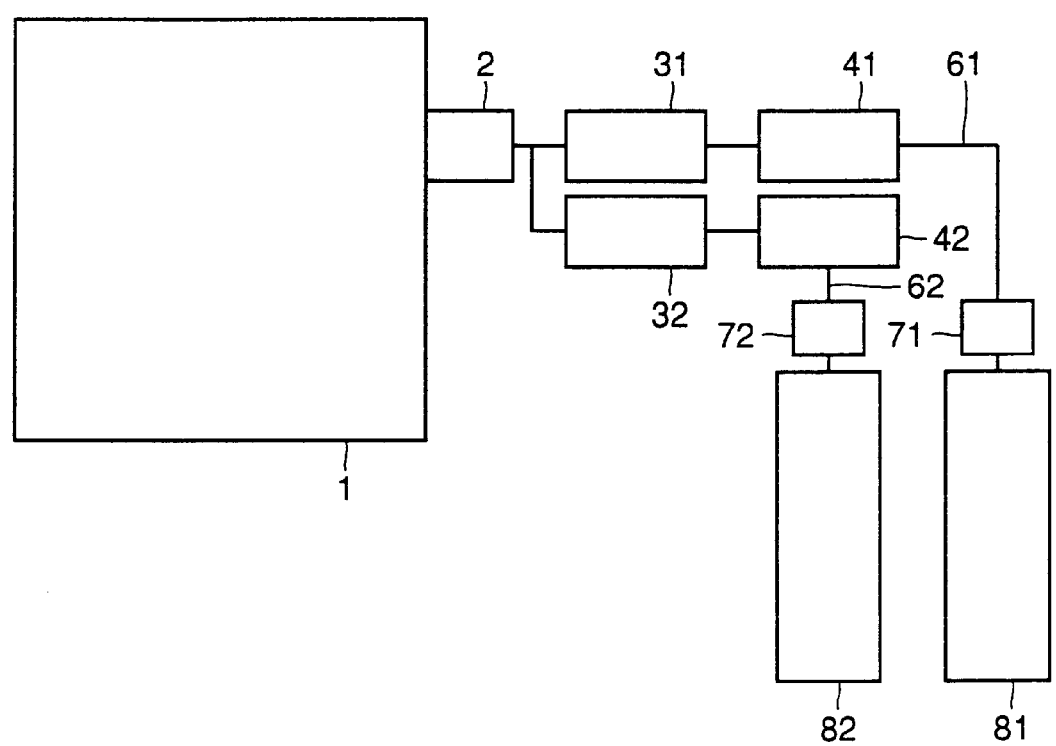
FIG. 6 is a block diagram showing a plasma system according to an embodiment 2 of the present invention.

As shown in FIG. 6, two gas supply systems are provided in the embodiment 2. In one of the gas supply systems, a gas pipe 61 supplies chlorine gas decompressed by a regulator 71 provided for a gas cylinder 81 to the pulse valve 2 through a back pressure controller 41 and a mass flow controller 31. In the other gas supply system, a gas pipe 62 supplies oxygen gas decompressed by a regulator 72 provided for a gas cylinder 82 to the pulse valve 2 through a back pressure controller 42 and a mass flow controller 32. A controller (not shown) controls the mass flow controllers 31 and 32 and the back pressure controllers 41 and 42. The controller can employ a control method similar to that in the embodiment 1.

The gases introduced from the gas pipes 61 and 62 are supplied into the pulse valve 2, to be pulsatively supplied into the reaction chamber 1. In this case, pressure detectors provided in the back pressure controllers 41 and 42 sequentially detect the pressures in the gas pipes 61 and 62, and the back pressure controllers 41 and 42 operate to maintain the pressures at inlets of the mass flow controllers 31 and 32 in the gas pipes 61 and 62 at prescribed values. The mass flow controllers 31 and 32 control the flow rates of the gases maintained at the constant pressures, for introducing the same into the pulse valve 2.

Figure 7A:
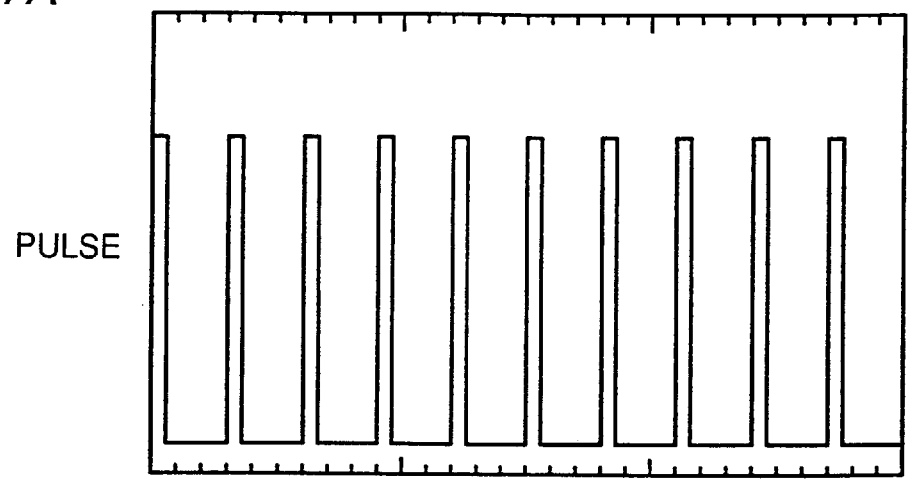
FIGS. 7A to 7C illustrate a pulse operation of a pulse valve, a flow rate of a gas supplied from the pulse valve and following pressure change in a reaction chamber respectively.
Figure 7B:
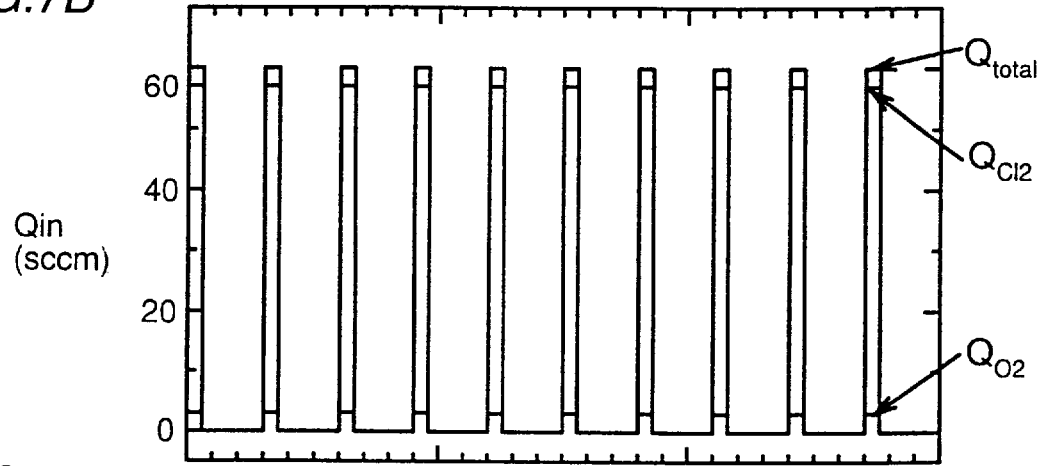
Figure 7C:
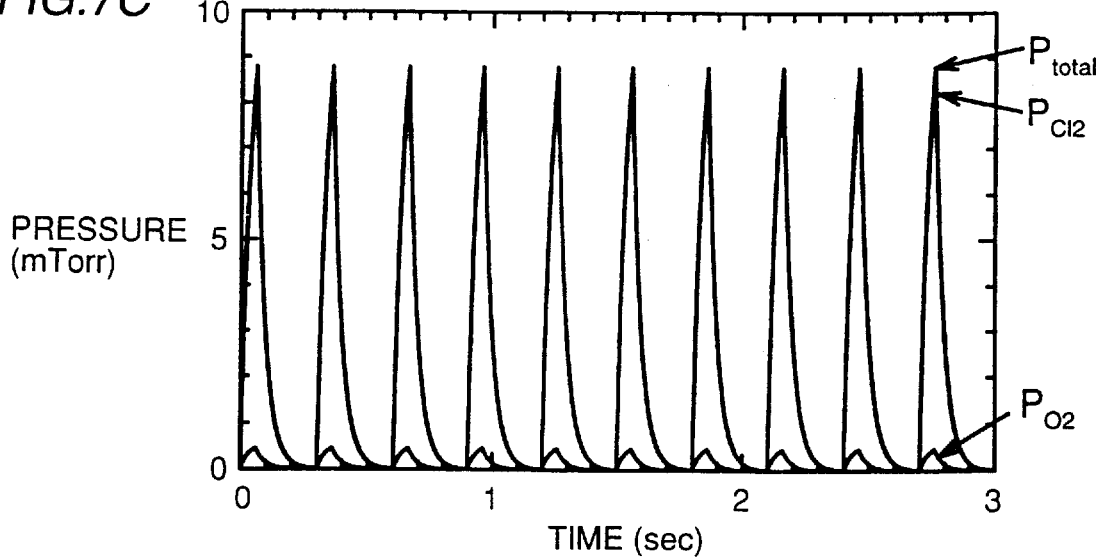

FIGS. 7A to 7C show pressure change etc. in case of supplying a mixing gas prepared by adding oxygen gas to chlorine gas in a flow ratio of 5%. An operating condition of the pulse valve 2 is similar to that of the embodiment 1. The flow rates of the chlorine gas and the oxygen gas are set at 57 sccm and 3 sccm respectively. The gases are set at pressures of 1 atm. at the inlets of the mass flow controllers 31 and 32 respectively.

According to the aforementioned structure, it is also possible to pulsatively supply a plurality of types of gases into the reaction chamber 1 through the single pulse valve 2 in a desired mixing ratio by providing the mass flow controllers 31 and 32 and the back pressure controllers 41 and 42 for the respective gas supply systems, similarly to the embodiment 1.

(Embodiment 3)

The embodiment 3 of the present invention is described with reference to FIGS. 8 and 9A to 9C. According to this embodiment 3, a plurality of pulse valves supply a plurality of gases. Also in the embodiment 3, two gas supply systems are provided similarly to the embodiment 2.

Figure 8:
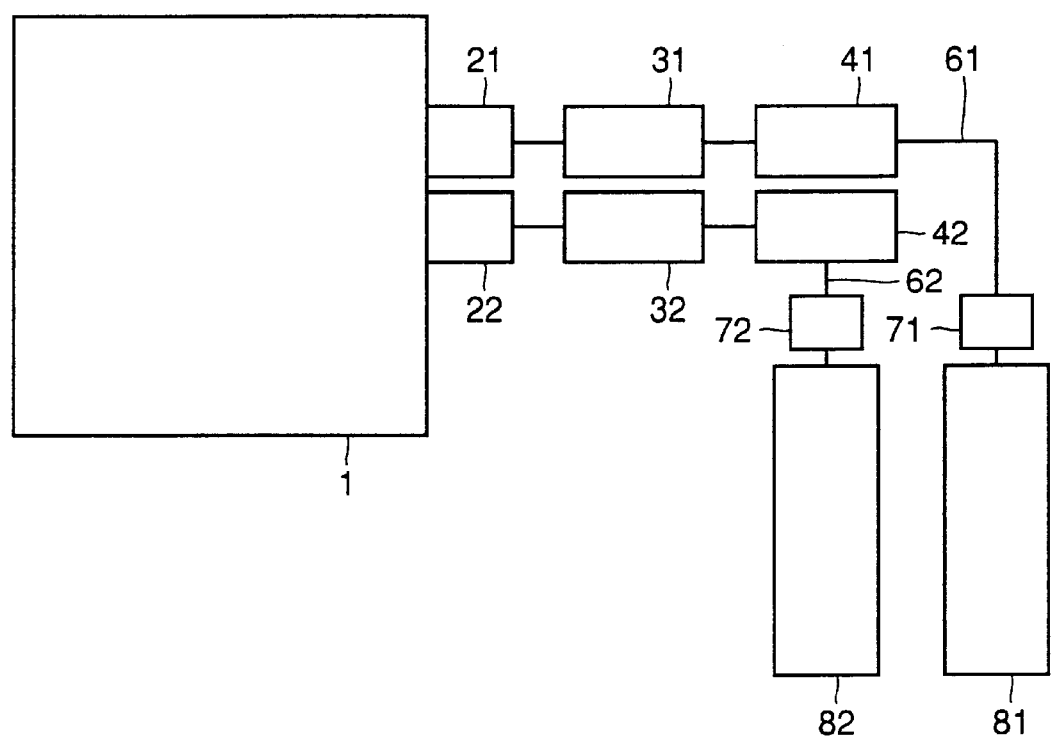
FIG. 8 is a block diagram showing a plasma system according to an embodiment 3 of the present invention.

As shown in FIG. 8, a gas pipe 61 provided on one of the gas supply systems supplies c-$C_4F_8$ gas decompressed by a regulator 71 provided for a gas cylinder 81 into a pulse valve 21 through a back pressure controller 41 and a mass flow controller 31. A gas pipe 62 provided on the other gas supply system supplies oxygen gas decompressed by a regulator 72 provided for a gas cylinder 82 into a pulse valve 22 through a back pressure controller 42 and a mass flow controller 32. A controller (not shown) controls the mass flow controllers 31 and 32, the back pressure controllers 41 and 42 and the pulse valves 21 and 22 by a method similar to that in each of the embodiments 1 and 2.

The gases introduced from the gas pipes 61 and 62 are supplied into the pulse valves 21 and 22, to be pulsatively supplied into a reaction chamber 1. In this case, pressures in the gas pipes 61 and 62 are controlled by a method similar to that in the embodiment 2, so that the mass flow controllers 31 and 32 control the flow rates of the gases maintained at constant pressures.

In the gaseous mixture of the chlorine gas and the oxygen gas employed in the embodiment 2, the pressures of the chlorine gas and the oxygen gas charged in the gas cylinders 81 and 82 are substantially identical to each other. In the gaseous mixture of the c-$C_4F_8$ gas and the oxygen gas, however, the pressure of the c-$C_4F_8$ gas charged in the gas cylinder 81 is lower than that of the oxygen gas charged in the gas cylinder 82. When the pressure difference between the gases is thus remarkable, it is easier to control the flow rates thereof through separate gas supply systems as compared with the embodiment 2 controlling the flow rates with the single pulse valve 2.

Figure 9A:
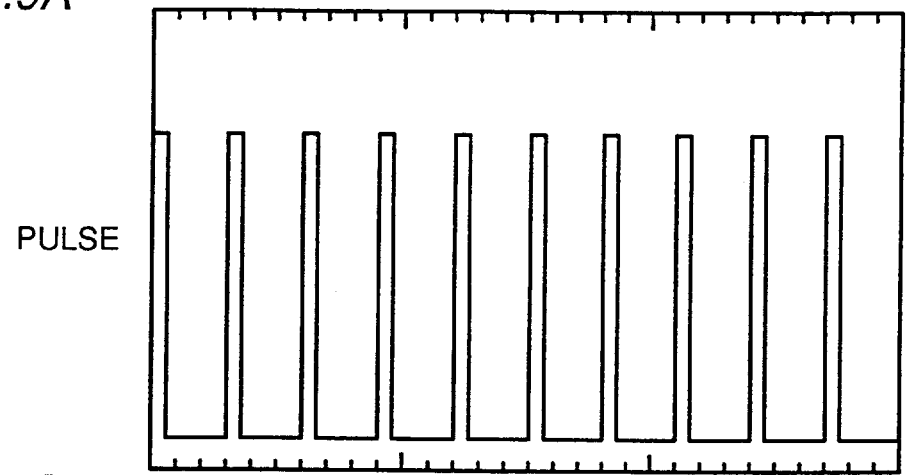
FIGS. 9A to 9C illustrate a pulse operation of a pulse valve, a flow rate of a gas supplied from the pulse valve and following pressure change in a reaction chamber respectively.
Figure 9B:
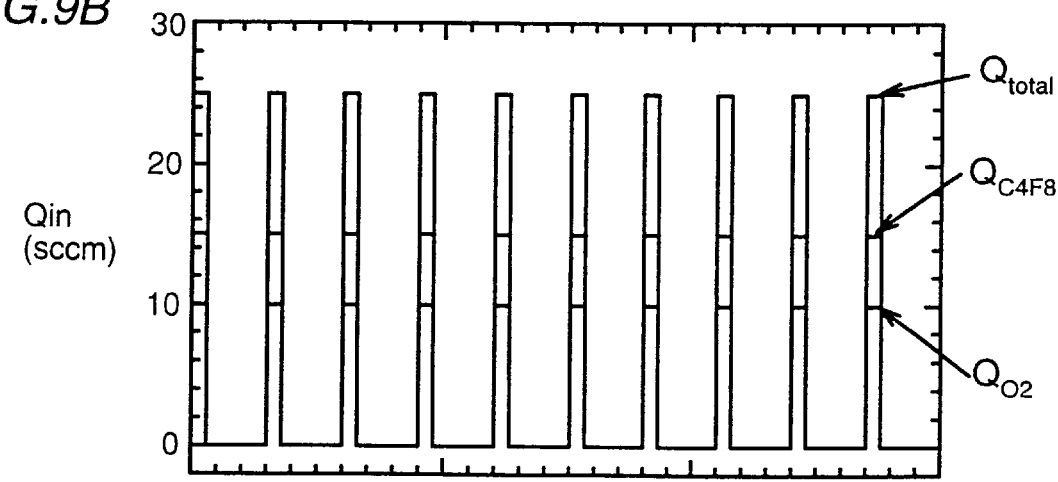
Figure 9C:
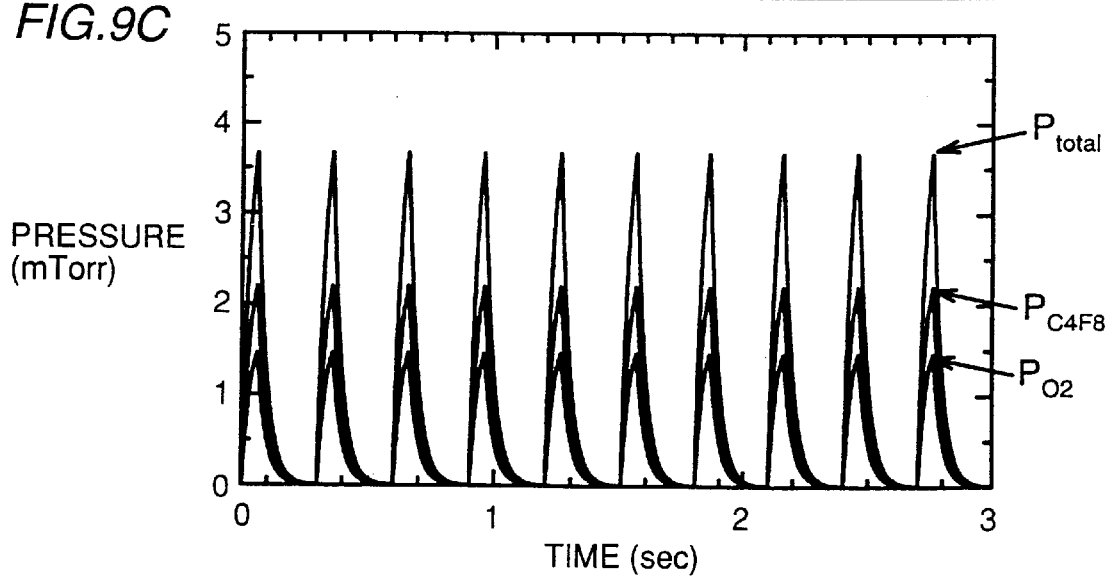

FIGS. 9A to 9C show fluctuation of pressures in case of supplying a gaseous mixture prepared by adding 40% of oxygen gas to c-$C_4F_8$ gas into the reaction chamber 1 from the gas supply systems. The flow rates of the c-$C_4F_8$ gas and the oxygen gas ($O_2$) are set at 15 sccm and 10 sccm respectively. It is understood from FIGS. 9A to 9C that the gas flow rates (Qin) and the pressure in the reaction chamber 1 are stably controlled.

While the flow rates of the gases supplied through the plurality of pulse valves 21 and 22 are different from each other due to different opening degrees of the pulse valves 21 and 22, desired gas flow rates can be obtained by employing the mass flow controllers 31 and 32 and the back pressure controllers 41 and 42 as described above.

(Embodiment 4)

The embodiment 4 of the present invention is now described with reference to FIG. 10. According to the embodiment 4, a single gas cylinder 8 supplies a gas into a plurality of reaction chambers 101 and 102.

Figure 10:
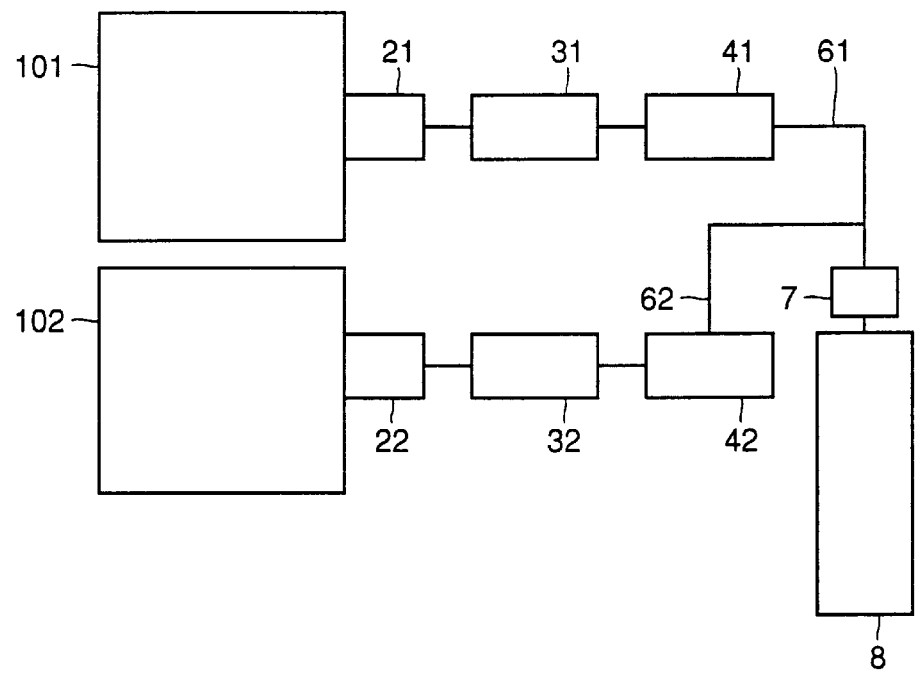
FIG. 10 is a block diagram showing a plasma system according to an embodiment 4 of the present invention.

As shown in FIG. 10, a regulator 7 decompresses the gas from the gas cylinder 8, and supplies the same into gas pipes 61 and 62. The gas supplied into the gas pipe 61 is supplied into the reaction chamber 101 through a back pressure controller 41, a mass flow controller 31 and a pulse valve 21. The gas introduced into the gas pipe 62 is supplied into the reaction chamber 102 through a back pressure controller 42, a mass flow controller 32 and a pulse valve 22. A controller (not shown) controls the mass flow controllers 31 and 32, the back pressure controllers 41 and 42 and the pulse valves 21 and 22 by a method similar to that in each of the embodiments 1 to 3.

The gas introduced into the gas pipes 61 and 62 is maintained at a constant pressure in a method similar to that in the embodiment 2, and supplied into the mass flow controllers 31 and 32. Thereafter the mass flow controllers 31 and 32 control the flow rate of the gas, which is introduced into the reaction chambers 101 and 102 through the pulse valves 21 and 22.

When supplying a gas from a single gas cylinder into a plurality of reaction chambers and starting processing in a certain reaction chamber during processing in another reaction chamber, the pressure in a pipe temporarily fluctuates to change the flow rate of the gas supplied into the reaction chambers. According to the embodiment 4, however, the mass flow controllers 31 and 32 and the back pressure controllers 41 and 42 are provided on respective gas supply systems for controlling the flow rate and the back pressures in the respective gas supply systems independently of each other, whereby the gas can be stably supplied into the reaction chambers 101 and 102. Even if the pressures in the gas pipes 61 and 62 fluctuate, therefore, the flow rate of an etching gas or the like introduced into the reaction chambers 101 and 102 can be maintained at a desired value for maintaining the pressures in the reaction chambers 101 and 102 under prescribed conditions.

(Embodiment 5)

The embodiment 5 of the present invention is now described with reference to FIG. 11.

While each of the embodiments 1 to 4 is on the premise that the gas must be decompressed through the regulator when taken out from the gas cylinder, a certain gas may not be decompressed through a regulator when taken out from a gas cylinder. In this case, no regulator may be provided, to result in a different equipment structure.

In general, a high-pressure gas must be decompressed through a regulator. A liquefied gas must also be decompressed through a regulator if charged at a high pressure. However, a gas having a low vapor pressure cannot smoothly flow when passed through a regulator. Therefore, no regulator is employed when using such a gas.

When employing the aforementioned gas having a low vapor pressure, it is unpreferable to employ a structure such as that according to the embodiment 4 in consideration of possible interference from another reaction chamber. While no problem arises by employing the structure of supplying a gas into a plurality of reaction chambers if the gas is charged at a pressure of at least several 10 atm., a gas such as $SiCl_4$ charged at a pressure of about several atm. is preferably supplied through an independent gas supply system in order to avoid interference from another reaction chamber. A gas passed through a regulator may also be supplied from an independent gas supply system, since the gas is readily influenced from another reaction chamber if the pressure of the gas from a gas cylinder is lower than a set value of the regulator.

In the embodiment 5 of the present invention, a gas having a low vapor pressure is employed.

Figure 11:
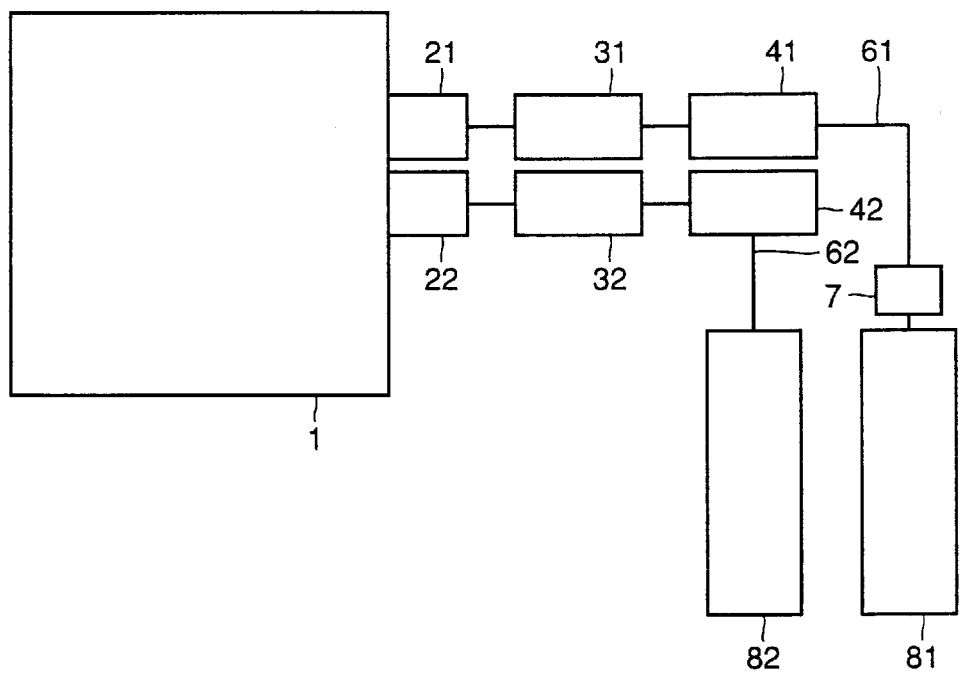
FIG. 11 is a block diagram showing a plasma system according to an embodiment 5 of the present invention.
Figure 12:
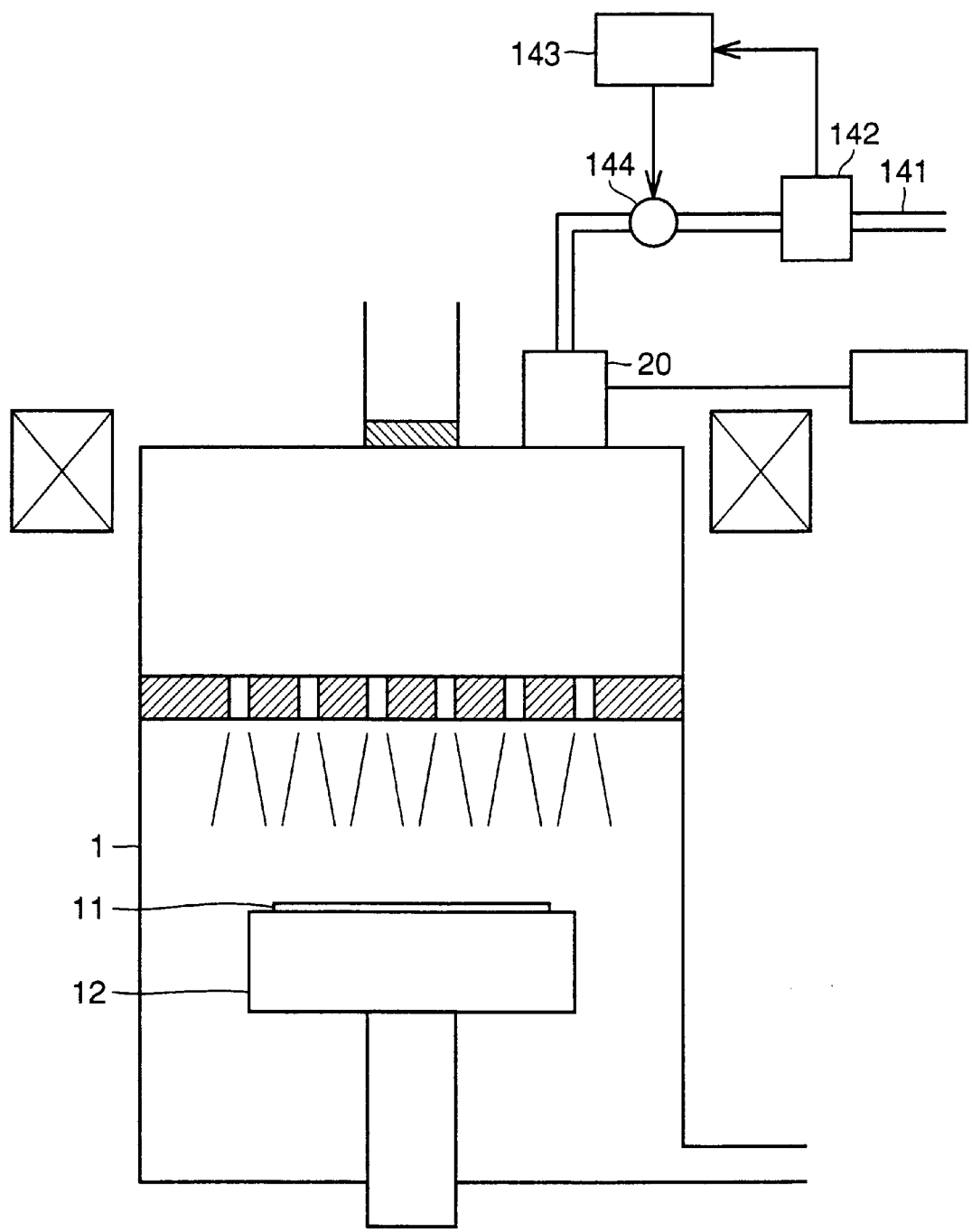
FIG. 12 is a block diagram showing an exemplary conventional plasma system.

As shown in FIG. 11, a regulator 7 decompresses a gas from a gas cylinder 81, for supplying the same into a reaction chamber 1 through a gas pipe 61, a back pressure controller 41, a mass flow controller 31 and a pulse valve 21. A gas having a low vapor pressure is supplied from a gas cylinder 82 into the reaction chamber 1 through a gas pipe 62, a back pressure controller 42, a mass flow controller 32 and a pulse valve 22. A controller (not shown) controls the mass flow controllers 31 and 32, the back pressure controllers 41 and 42 and the pulse valves 21 and 22 similarly to each of the embodiments 1 to 4.

The controller controls the pressures of the gases introduced into the gas pipes 61 and 62 in a method similar to that in the embodiment 2, and introduces the same into the mass flow controllers 31 and 32.

The gas cylinder 82 is independently connected with each reaction chamber 1 for a gas such as liquefied gas whose pressure is too low to use the regulator 7, in order to avoid interference from another reaction chamber. Thus, the gas can be maintained at a prescribed flow rate, for maintaining the pressure in the reaction chamber 1 under prescribed conditions.

The types of the gases employed in the embodiments 1 to 5, the operating conditions of the pulse valves 2, 21 and 22, the gas flow rates and the pressures are mere illustrative and the present invention is not restricted to these.

According to the present invention, as hereinabove described, a gas can be stably supplied into a reaction chamber at a desired flow rate by providing a gas flow controller and a back pressure controller. In case of supplying a plurality of gases into a reaction chamber, the mixing ratio in the reaction chamber can be controlled by performing the above flow rate control or the like for each gas.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A system for manufacturing a semiconductor device comprising:
    a reaction chamber;
    a gas supply system for supplying a gas into said reaction chamber;
    a gas flow controller provided on said gas supply system for controlling the flow rate of said gas supplied to said pulse valve;
    a back pressure controller provided on said gas supply system for controlling the back pressure of said pulse valve; and
    a control part for controlling the operations of at least one of said gas flow controller and said back pressure controller based upon a selection by said control part to control at least one of back pressure and gas flow based on a change of pressure in said reaction chamber and a change in flow rate of said gas.

2. The system in accordance with claim 1, wherein said back pressure controller is connected to an inlet of said gas flow controller.

3. The system in accordance with claim 1, wherein said gas flow controller includes a flow meter and a variable flow control valve,
    said back pressure controller includes a pressure gauge and a pressure control valve, and
    said control part selects at least either flow control by said variable flow control valve or back pressure control by said pressure control valve in response to flow rate change of said gas detected by said flow meter.

4. The system in accordance with claim 1, wherein said gas flow controller includes a flow meter and a variable flow control valve, said back pressure controller includes a pressure gauge and a pressure control valve, and said control part selects at least either flow control by said variable flow control valve or back pressure control by said pressure control valve in response to the pressure value of said gas detected by said pressure gauge.

5. The system in accordance with claim 1, wherein said gas flow controller is a mass flow controller, and said pulse valve and said mass flow controller are integrated or directly connected with each other.

6. The system in accordance with claim 1, wherein said gas supply system has a gas cylinder and a regulator for reducing the pressure of said gas from said gas cylinder for preventing said pulse valve and said gas flow controller from breakage, and said back pressure controller has both of a decompressing function and a pressure intensifying function.

7. The system in accordance with claim 1, wherein said gas supply system has a gas cylinder charged with a gas having a low vapor pressure and is connected to only one said reaction chamber.

8. The system in accordance with claim 1, comprising a plurality of said gas supply systems, wherein said gas flow controller and said back pressure controller are provided on each said gas supply system.

9. The system in accordance with claim 8, wherein one said pulse valve is provided for said plurality of gas supply systems.

10. The system in accordance with claim 8, wherein said pulse valve is provided for each said gas supply system.

11. The system in accordance with claim 1, wherein said gas supply system includes a gas cylinder, and said gas supply system shares said gas cylinder with another gas supply system connected with another reaction chamber.

* * * * *